United States Patent
Jung et al.

(10) Patent No.: US 7,879,703 B2
(45) Date of Patent: Feb. 1, 2011

(54) METHOD OF FABRICATING SEMICONDUCTOR DEVICE FOR REDUCING THERMAL BURDEN ON IMPURITY REGIONS OF PERIPHERAL CIRCUIT REGION

(75) Inventors: Kyoung-Ho Jung, Suwon-si (KR); Makoto Yoshida, Suwon-si (KR); Jae-Rok Kahng, Seoul (KR); Chul Lee, Seoul (KR); Joon-Seok Moon, Seoul (KR); Cheol-Kyu Lee, Yongin-si (KR); Sung-Il Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/321,335

(22) Filed: Jan. 20, 2009

(65) Prior Publication Data

US 2009/0186471 A1 Jul. 23, 2009

(30) Foreign Application Priority Data

Jan. 21, 2008 (KR) .................. 10-2008-0006281

(51) Int. Cl.
*H01L 21/425* (2006.01)

(52) U.S. Cl. .................. 438/527; 438/275; 438/199; 438/128; 257/296

(58) Field of Classification Search .......... None
See application file for complete search history.

(56) References Cited

U.S. PATENT DOCUMENTS

| | | | |
|---|---|---|---|
| 5,946,230 A | | 8/1999 | Shimizu et al. |
| 6,287,913 B1 | | 9/2001 | Agnello et al. |
| 6,309,960 B1 | | 10/2001 | Sukekawa |
| 6,686,617 B2 * | | 2/2004 | Agnello et al. .............. 257/296 |
| 6,699,746 B2 | | 3/2004 | Chung et al. |
| 7,001,808 B2 | | 2/2006 | Tsukamoto et al. |
| 7,179,744 B2 | | 2/2007 | Lee et al. |
| 7,339,242 B2 | | 3/2008 | Cho et al. |
| 7,435,657 B2 | | 10/2008 | Shin |
| 7,462,542 B2 * | | 12/2008 | Liu et al. .................. 438/275 |
| 7,692,234 B2 | | 4/2010 | Adachi et al. |

(Continued)

FOREIGN PATENT DOCUMENTS

JP 4-188762 7/1992

(Continued)

*Primary Examiner*—Ha Tran T Nguyen
*Assistant Examiner*—Shantanu C Pathak
(74) *Attorney, Agent, or Firm*—Mills & Onello, LLP

(57) ABSTRACT

A method of fabricating a semiconductor device for reducing a thermal burden on impurity regions of a peripheral circuit region includes preparing a substrate including a cell active region in a cell array region and peripheral active regions in a peripheral circuit region. A cell gate pattern and peripheral gate patterns may be formed on the cell active region and the peripheral active regions. First cell impurity regions may be formed in the cell active region. A first insulating layer and a sacrificial insulating layer may be formed to surround the cell gate pattern and the peripheral gate patterns. Cell conductive pads may be formed in the first insulating layer to electrically connect the first cell impurity regions. The sacrificial insulating layer may be removed adjacent to the peripheral gate patterns. First and second peripheral impurity regions may be sequentially formed in the peripheral active regions adjacent to the peripheral gate patterns.

16 Claims, 10 Drawing Sheets

U.S. PATENT DOCUMENTS

| | | |
|---|---|---|
| 2001/0031535 A1 | 10/2001 | Agnello et al. |
| 2003/0124776 A1* | 7/2003 | Chung et al. ............... 438/128 |
| 2003/0139027 A1 | 7/2003 | Ikeda et al. |
| 2006/0035437 A1 | 2/2006 | Mitsuhira et al. |
| 2006/0115941 A1 | 6/2006 | Shin |
| 2006/0186485 A1 | 8/2006 | Cho et al. |
| 2006/0263985 A1* | 11/2006 | Kang et al. ............... 438/275 |
| 2008/0277710 A1 | 11/2008 | Kim et al. |
| 2009/0001468 A1 | 1/2009 | Shin |

FOREIGN PATENT DOCUMENTS

| | | |
|---|---|---|
| JP | 10-173146 | 6/1998 |
| JP | 11-17129 | 1/1999 |
| JP | 2000-277610 | 10/2000 |
| JP | 2003-289112 | 10/2003 |
| KR | 10-0295039 | 4/2001 |
| KR | 2001-0067355 | 7/2001 |
| KR | 2003-0058573 | 7/2003 |
| KR | 10-0400173 | 9/2003 |
| KR | 10-0444306 | 8/2004 |
| KR | 10-2004-0085349 | 10/2004 |
| KR | 10-2005-0036627 | 4/2005 |
| KR | 10-0571632 | 4/2006 |
| KR | 10-2006-0059088 | 6/2006 |
| KR | 10-2006-0093974 | 8/2006 |

* cited by examiner

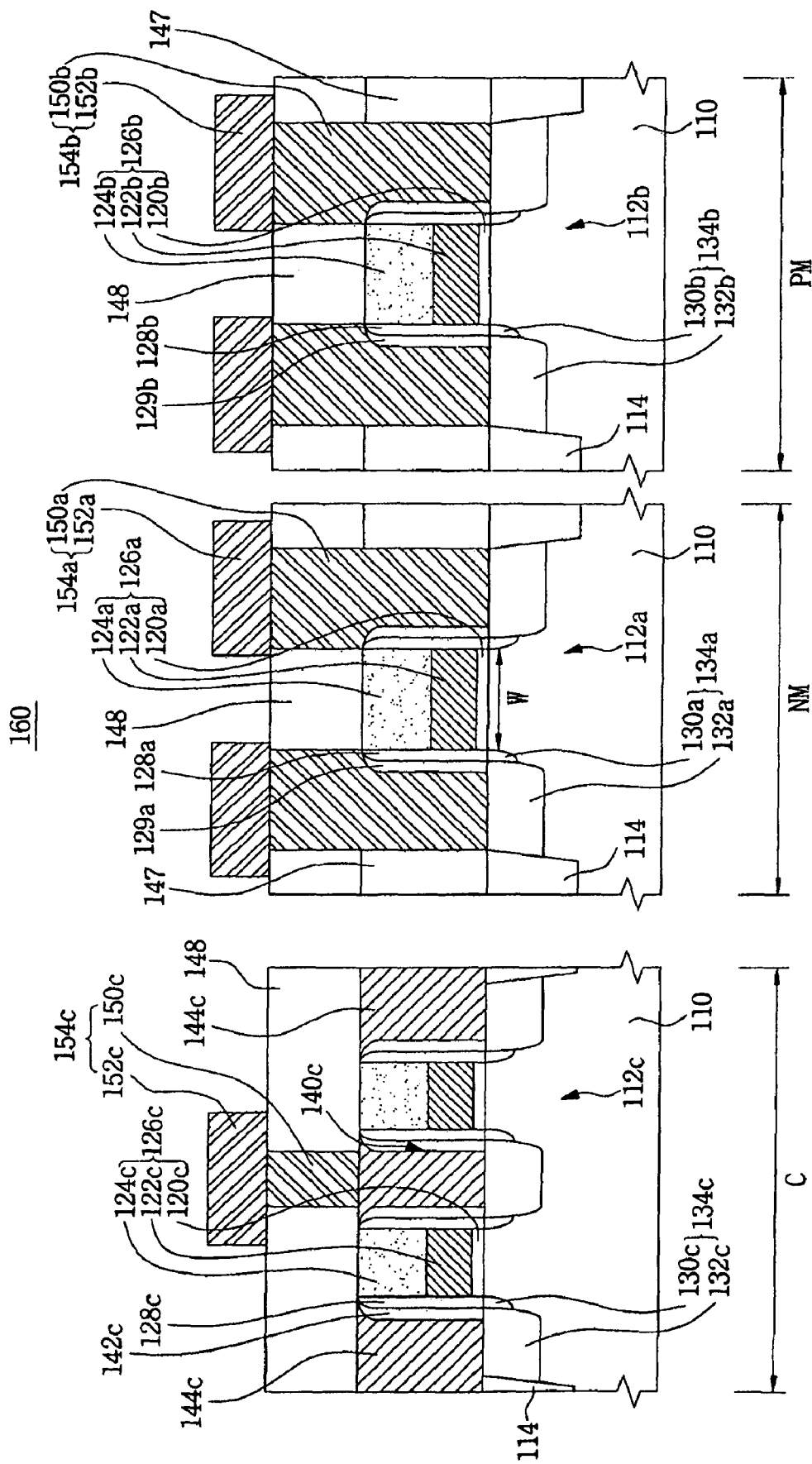

METHOD OF FABRICATING SEMICONDUCTOR DEVICE FOR REDUCING THERMAL BURDEN ON IMPURITY REGIONS OF PERIPHERAL CIRCUIT REGION

CROSS-REFERENCE TO RELATED APPLICATION

This application claims priority under 35 USC §119 to Korean Patent Application No. 10-2008-0006281, filed Jan. 21, 2008, in the Korean Intellectual Property Office (KIPO), the entire contents of which are herein incorporated by reference.

BACKGROUND

1. Field

Exemplary embodiments relate to a method of fabricating a semiconductor device for reducing a thermal burden on impurity regions of a peripheral circuit region.

2. Description of Related Art

Generally, a semiconductor memory device may include transistors on a cell array region and a peripheral circuit region of a semiconductor substrate. The transistors may respectively have effective channel lengths corresponding to sizes of active regions in the semiconductor substrate. The effective channel lengths may result from source and drain regions of the transistors. The source and drain regions may be formed in the active regions using impurity ions through performance of an ion-implanting process and an ion-diffusing process. The ion-implanting process may allow the source and drain regions to occupy an initial position thereof in the active regions corresponding to a geometric shape of gates in the transistors. The ion-diffusing process may allow the source and drain regions to be radially diffused from the initial position toward a neighboring region surrounding the initial position using heat budget, which may be caused by semiconductor fabrication processes. Accordingly, the ion-diffusing process should be applied to the semiconductor substrate in consideration of the sizes of the active regions.

SUMMARY

Exemplary embodiments are directed to a method of fabricating a semiconductor device comprising preparing a substrate including a cell array region and a peripheral circuit region. The cell array region and the peripheral circuit region may have a cell active region and peripheral active regions. A cell gate pattern is formed on the cell active region and peripheral gate patterns on the peripheral active regions. First cell impurity regions may be formed in the cell active region. The first cell impurity regions may be formed adjacent to the cell gate pattern. A first insulating layer and a sacrificial insulating layer may be formed on the cell array region and the peripheral circuit region, respectively, to surround the cell gate pattern and the peripheral gate patterns. Cell conductive pads may be formed in the first insulating layer of the cell array region to electrically connect the first cell impurity regions. The sacrificial insulating layer may be removed adjacent to the peripheral gate patterns. First and second peripheral impurity regions may be sequentially formed in the peripheral active regions adjacent to the peripheral gate patterns. A first temperature process step may be performed at a first temperature more than about 700° C. before the removing of the sacrificial insulating layer, and a second temperature process step may be performed at a second temperature less than the first temperature after the removing of the sacrificial insulating layer.

According to selective embodiments, the method may further comprise, before forming the first insulating layer and the sacrificial insulating layer, conformally forming a spacer layer on the cell active region and the peripheral active regions to cover the cell gate pattern and the peripheral gate patterns. The removing of the sacrificial insulating layer may be performed until the spacer layer adjacent to a lower portion of the peripheral gate patterns is exposed.

According to selective embodiments, the forming of the first peripheral impurity regions may comprise forming a photoresist pattern in the cell array region to expose the peripheral active regions of the peripheral circuit region. The spacer layer on the peripheral active regions may be etched using the photoresist pattern as a mask to form first peripheral spacers on sidewalls of the peripheral gate patterns. The photoresist pattern may be removed from the cell array region. A first mask pattern may be formed in the cell array region and the peripheral circuit region to expose a selective peripheral active region and cover the cell active region and the remaining peripheral active region. First impurity ions may be formed in the selective peripheral active region using the photoresist pattern, the first peripheral spacers, and a selective peripheral gate pattern on the selective peripheral active region as a mask.

According to selective embodiments, the method may further comprise forming second peripheral spacers on the first peripheral spacers of the selective peripheral gate pattern. Third impurity ions may be implanted in the selective peripheral active region using the first mask pattern, the first and second peripheral spacers, and the selective peripheral gate pattern as a mask to form third peripheral impurity regions. The first mask pattern may be removed from the cell array region and the peripheral circuit region. The second peripheral impurity regions have a higher concentration than the first peripheral impurity regions. The first and third impurity ions have the same conductivity. The second peripheral spacers comprise a material layer having a lower dielectric constant than the first peripheral spacers.

According to selective embodiments, the forming of the second peripheral impurity regions may comprise forming a second mask pattern in the cell array region and the peripheral circuit region to expose the remaining peripheral active region and cover the cell active region and the selective peripheral active region. Second impurity ions may be implanted in the remaining peripheral active region using the second mask pattern, the first peripheral spacers, and the remaining peripheral gate pattern on the remaining peripheral active region The second peripheral impurity regions have different conductivity from the first peripheral impurity regions. According to selective embodiments, the method may further comprise forming third peripheral spacers on the first peripheral spacers of the remaining peripheral gate pattern. Fourth impurity ions may be implanted in the remaining peripheral active region using the second mask pattern, the first and third peripheral spacers, and the remaining peripheral gate pattern as a mask to form fourth peripheral impurity regions. The second mask pattern may be removed from the cell array region and the peripheral circuit region. The fourth peripheral impurity regions have a higher concentration than the second peripheral impurity regions. The second and fourth impurity ions have the same conductivity. And the third peripheral spacers comprise a material layer having a lower dielectric constant than the first peripheral spacers.

According to selective embodiments, the method may further comprise, before forming the first insulating layer and the sacrificial insulating layer, forming second cell impurity regions in the cell active region to be apart from the cell gate pattern by a thickness of the spacer layer on each of sidewalls of the cell gate pattern. The second cell impurity regions have a higher concentration than the first cell impurity regions.

According to selective embodiments, the forming of the cell conductive pads may comprise forming preliminary cell contact holes in the first insulating layer of the cell array region using the cell gate pattern and the spacer layer as a mask to expose the spacer layer. The spacer layer may be etched through the preliminary cell contact holes to form first cell spacers and to form cell contact holes exposing the cell active region adjacent to the cell gate patter. A conductive layer may be formed on the first insulating layer and the sacrificial insulating layer to fill the cell contact holes. The conductive layer may be etched until the first insulating layer and the sacrificial insulating layer are exposed.

According to selective embodiments, the method may further comprise, before forming the cell conductive pads, forming second cell spacers on sidewalls of the first cell spacers. The second cell spacers comprise a material having a lower dielectric constant than the first cell spacers.

According to selective embodiments, the first temperature process step may comprise reflowing the first insulating layer and the sacrificial insulating layer at a temperature in the range of about 700 to 850° C. after the forming of the first insulating layer and the sacrificial insulating layer, and annealing the cell conductive pads at a temperature in the range of about 800 to 900° C. after the forming of the cell conductive pads, in a case in which the cell conductive pads are formed of a poly-Si layer.

According to selective embodiments, the first insulating layer and the sacrificial insulating layer may be formed of the same material using a one-time deposition process. The one-time deposition process may comprise forming an insulating layer on the spacer layer. The insulating layer may be reflowed to surround the cell gate pattern and the peripheral gate patterns.

According to other embodiments, the method may further comprise forming a second insulating layer in the peripheral circuit region to surround the peripheral gate patterns.

According to other embodiments, a temperature forming the first insulating layer is higher than that forming the second insulating layer.

According to other embodiments, the first insulating layer is a boron phosphorus silicate glass (BPSG) layer, and the second insulating layer is a high-density plasma (HDP) oxide layer.

According to other embodiments, the method may further comprise planarizing the second insulating layer until the cell gate pattern and the peripheral gate patterns are exposed.

According to other embodiments, the method may further comprise forming a third insulating layer on the first insulating layer and the second insulating layer to cover the cell gate pattern and the peripheral gate patterns. Cell interconnections may be formed in the first insulating layer and the third insulating layer to electrically connect the cell conductive pads. Peripheral interconnections may be formed in the second insulating layer and the third insulating layer to electrically connect the first and second peripheral impurity regions.

According to other embodiments, the peripheral active regions comprise an NMOS active region and a PMOS active region. The peripheral gate patterns are formed to have an NMOS gate pattern and a PMOS gate pattern respectively on the NMOS active region and the PMOS active region. The first and third peripheral impurity regions are formed to have n-type conductivity adjacent to the NMOS gate pattern. The second and fourth peripheral impurity regions are formed of p-type conductivity adjacent to the PMOS gate pattern.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 2 through 10 are schematic cross-sectional views illustrating a method of fabricating a semiconductor device taken along lines I-I', II-II', and III-III' of FIG. 1.

DETAILED DESCRIPTION OF THE EMBODIMENTS

Various exemplary embodiments will now be described more fully with reference to the accompanying drawings in which some exemplary embodiments are shown. It will be understood that although the terms "preliminary groove, groove, preliminary trench, and trench" are used herein to describe various elements, the elements should not be limited by these terms. These terms are only used to distinguish one element from another element. As used herein, the term "and/or" includes any and all combinations of one or more of the associated listed items. Spatially relative terms, such as "under", "selected", "other", "remaining", "upper", "lower", and "on" and the like, may be used herein for ease of description to describe one element or feature's relationship to (an) other element(s) or feature(s) as illustrated in the figures. The terminology used herein is for the purpose of describing particular embodiments only and is not intended to be limiting of the exemplary embodiments.

Figure 1:
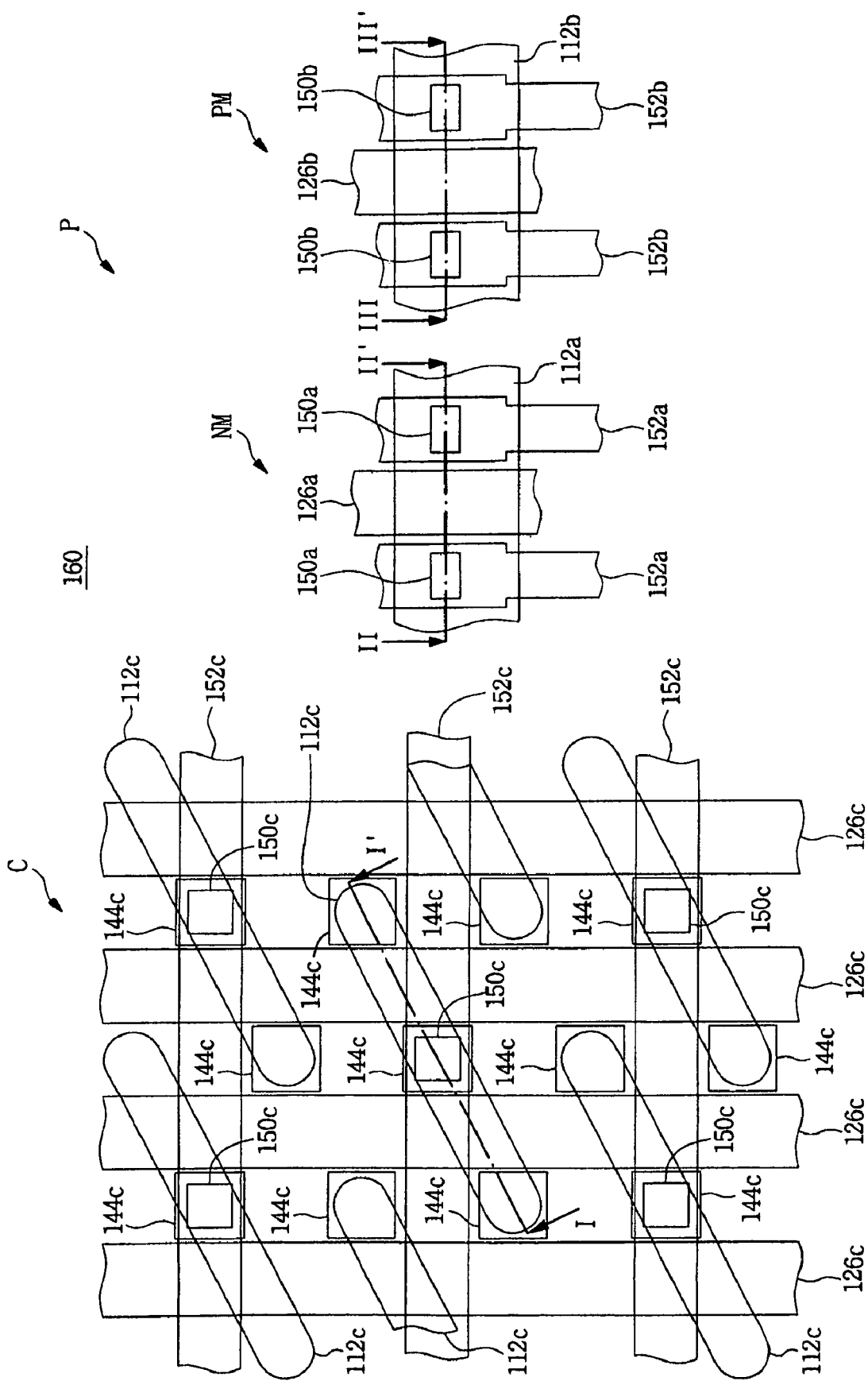
FIG. 1 is a schematic plan view illustrating a method of fabricating a semiconductor device according to exemplary embodiments.

FIG. 1 contains a plan view illustrating a method of fabricating a semiconductor device according to exemplary embodiments. FIGS. 2 through 10 are schematic cross-sectional views illustrating a method of fabricating a semiconductor device taken along lines I-I', II-II', and III-III' of FIG. 1 according to exemplary embodiments.

In FIGS. 1 through 10, reference characters "C" and "P" denote a cell array region and a peripheral circuit region, respectively, and "NM" and "PM" denote a peripheral NMOS region and a peripheral PMOS region, respectively. The peripheral NMOS region NM and the peripheral PMOS region PM may constitute the peripheral circuit region P.

Figure 2:
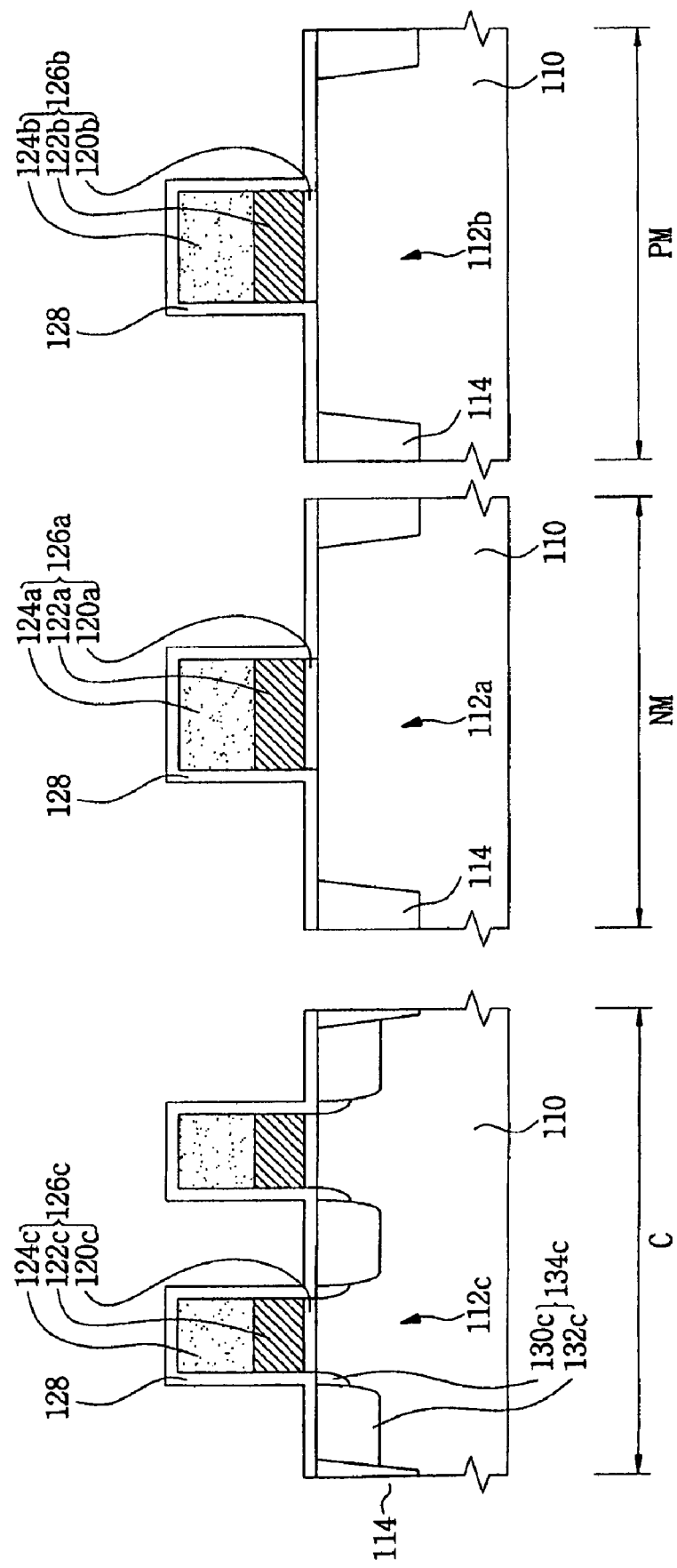

Referring to FIGS. 1 and 2, a device isolation layer 114 is formed in a substrate 110 as illustrated FIG. 2 according to exemplary embodiments. The device isolation layer 114 may be separated into a cell array region C and a peripheral circuit region P as illustrated FIGS. 1 and 2. The device isolation layer 114 may be formed using a shallow trench isolation (STI) technique. The device isolation layer 114 may be an insulating layer, such as a silicon oxide layer, a silicon nitride layer, a silicon oxynitride layer, or combination thereof. The device isolation layer 114 may be formed in peripheral circuit region P. The device isolation layer 114 may be separated into the peripheral NMOS region NM and the peripheral PMOS region PM of FIGS. 1 and 2 in peripheral circuit region P, thus defining a cell active region 112c in the cell array region C, an NMOS active region 112a in the peripheral NMOS region NM, and a PMOS active region 112b in the peripheral PMOS region PM. The cell active region 112c, the NMOS active region 112a, and the PMOS active region 112b may be doped with p-type, p-type, and n-type impurity ions, respectively.

According to exemplary embodiments, cell gate patterns 126c may be formed in the cell array region C as illustrated in FIGS. 1 and 2. An NMOS gate pattern 126a and a PMOS gate pattern 126b may be formed in the peripheral circuit region P as illustrated in FIGS. 1 and 2. The NMOS gate pattern 126a and the PMOS gate pattern 126b may constitute peripheral gate patterns. In this case, the cell gate patterns 126c may be formed across the cell active regions 112c. The NMOS gate pattern 126a and the PMOS gate pattern 126b may be formed across the NMOS active region 112a and the PMOS active region 112b, respectively. Each of the cell gate patterns 126c may comprise a cell gate insulating layer 120c, a cell gate electrode 122c, and a cell capping layer pattern 124c that are sequentially stacked, as illustrated in FIG. 2. The cell gate electrode 122c may comprise a polysilicon (poly-Si) layer or polycide. When the cell gate electrode 122c is formed of polycide, it may comprise a poly-Si layer and a tungsten silicide layer that are sequentially stacked. Although the cell gate patterns 126c are formed on the cell active region 112c, the cell gate patterns 126c may be recessed in the cell active region 112c.

According to exemplary embodiments, the NMOS gate pattern 126a may comprise an NMOS gate insulating layer 120a, an NMOS gate electrode 122a, and an NMOS capping layer pattern 124a that are sequentially stacked, as illustrated in FIG. 2. The NMOS gate electrode 122a may comprise the same material as the cell gate electrode 122c. Also, the PMOS gate pattern 126b may comprise a PMOS gate insulating layer 120b, a PMOS gate electrode 122b, and a PMOS capping layer pattern 124b that are sequentially stacked, as illustrated in FIG. 2. The PMOS gate electrode 122b may comprise the same material as the cell gate electrode 122c. The cell gate insulating layer 120c, the NMOS gate insulating layer 120a and PMOS gate insulating layer 120b may comprise insulating material. The cell capping layer pattern 124c, NMOS capping layer pattern 124a and PMOS capping layer pattern 124b may comprise the same or different material as or from the cell gate insulating layer 120c.

According to exemplary embodiments, first cell impurity regions 130c may be formed in the cell active region 112c to overlap both sides of the cell gate patterns 126c as illustrated in FIG. 2. The first cell impurity regions 130c may be doped with n-type impurity ions. A spacer layer 128 may be formed on the NMOS active region 112a, the PMOS active region 112b, the cell active region 112c and the device isolation layer 114 to cover the cell gate patterns 126c, the NMOS gate pattern 126a, and the PMOS gate pattern 126b. The spacer layer 128 may comprise the same or different material as or from the cell capping layer pattern 124c. The spacer layer 128 may be a silicon nitride layer.

According to exemplary embodiments, second cell impurity regions 132c may be formed in the cell active region 112c using the cell gate patterns 126c as a mask as illustrated in FIG. 2. The second cell impurity regions 132c may be the same conductivity as the first cell impurity region 130c. In this case, the second cell impurity regions 132c may be formed apart from the cell gate patterns 126c by a thickness of the spacer layer 128 on each of sidewalls of the cell gate patterns 126c. The first cell impurity regions 130c may be protruded from the second cell impurity regions 132c to the thickness of the spacer layer 128 on each of the sidewalls of the cell gate patterns 126c. The second cell impurity regions 132c may have a higher concentration than the first cell impurity regions 130c. Thus, the first and second cell impurity regions 130c and 132c may constitute cell source or drain region 134c. As such, cell transistors including the cell gate patterns 126c and the cell source and drain regions 134c may be completed.

Figure 3:
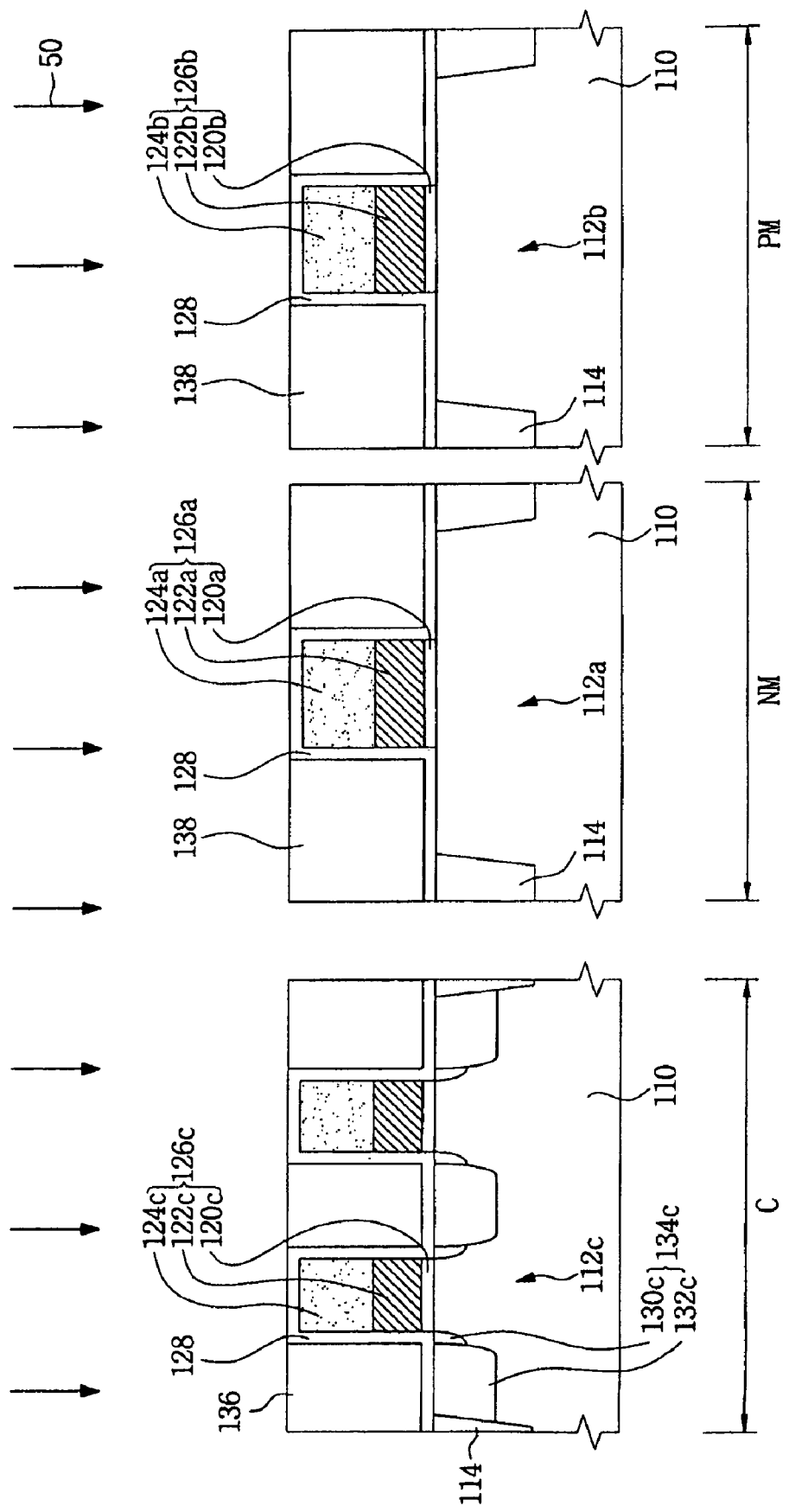

Referring to FIGS. 1 and 3, a cell lower interlayer insulating layer 136 and a sacrificial peripheral interlayer insulating layer 138 may be formed on the cell array region C and the peripheral circuit region P to cover the cell gate patterns 126c, the NMOS gate pattern 126a, and the PMOS gate pattern 126b as illustrated in FIG. 3, according to exemplary embodiments. The cell lower interlayer insulating layer 136 and the peripheral interlayer insulating layer 138 may be formed to partially expose the spacer layer 128 in the cell array region C and the peripheral circuit region P. The peripheral interlayer insulating layer 138 may cover the peripheral NMOS region NM and the peripheral PMOS region PM in the peripheral circuit region P. The cell lower interlayer insulating layer 136 and the interlayer peripheral insulating layer 138 may be formed at the same time using a one-time deposition process.

According to exemplary embodiments, the cell lower interlayer insulating layer 136 and the peripheral interlayer insulating layer 138 may also be formed of a material layer having an etch selectivity with respect to the spacer layer 128. The cell lower interlayer insulating layer 136 and the peripheral interlayer insulating layer 138 may comprise a silicon oxide layer having good gap-fill and planarization characteristics, for exemplary, a boron phosphorus silicate glass (BPSG) layer. In this case, the BPSG layer may be formed using a low-pressure chemical vapor deposition (LPCVD) technique and be subjected to a reflow process (refer to 50) at a first temperature, for example, a high temperature of about 700 to 850° C., thereby effectively filling a gap between the cell gate patterns 126c of the cell array region C with a higher density than the peripheral circuit region P as illustrated in FIG. 3.

Figure 4:
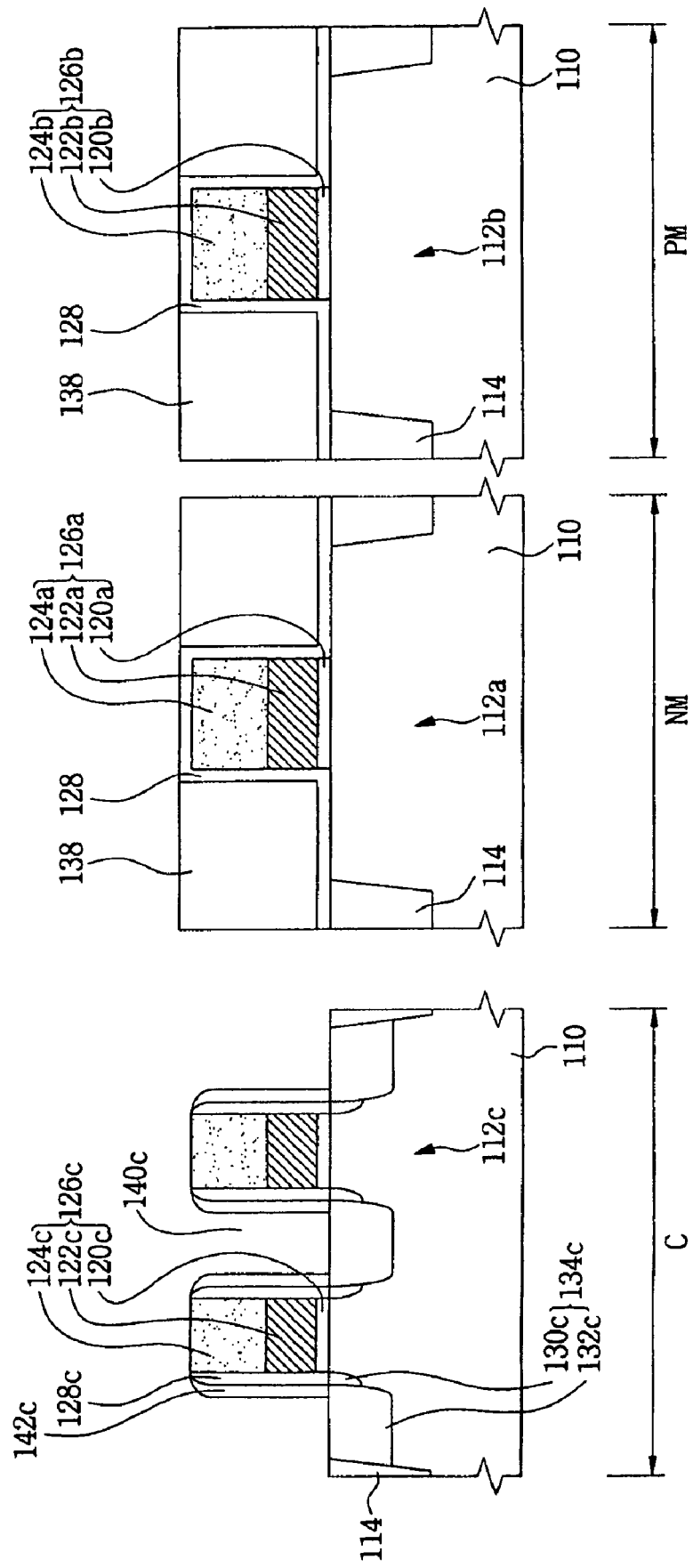

Referring to FIGS. 1 and 4, the cell lower interlayer insulating layer 136 of the cell array region C may be selectively patterned using the spacer layer 128 as an etch stop layer, thereby forming preliminary cell contact holes to expose the spacer layer 128 adjacent to and on the cell gate patterns 126c as illustrated in FIG. 4, according to exemplary embodiments. In this case, the preliminary cell contact holes may be formed by a self-aligned process using the cell gate patterns 126c and the spacer layer 128 as an etch mask. After the formation of the preliminary cell contact holes, the spacer layer 128 may be anisotropically etched until the cell active region 112c is exposed, thereby forming cell contact holes 140c to expose the cell source and drain regions 134c and forming first cell spacers 128c to surround the cell contact holes 140c as illustrated in FIG. 4.

An insulating layer may be formed on the cell gate patterns 126c and the cell lower interlayer insulating layer 136 to conformally cover the cell contact holes 140c according to exemplary embodiments. The insulating layer may comprise a material layer having a lower dielectric constant than the first cell spacers 128c, for exemplary, a silicon oxide layer. The insulating layer may be anisotropically etched until the cell active region 112c, the cell gate patterns 126c, the cell lower interlayer insulating layer 136 and the peripheral interlayer insulating layer 138 are exposed, thereby forming second cell spacers 142c on sidewalls of the first cell spacers 128c as illustrated in FIG. 4. The second cell spacers 142c may function to reduce a parasitic capacitance between a subsequent conductive layer for filling the cell contact holes 140c and the cell gate patterns 126c.

Figure 5:
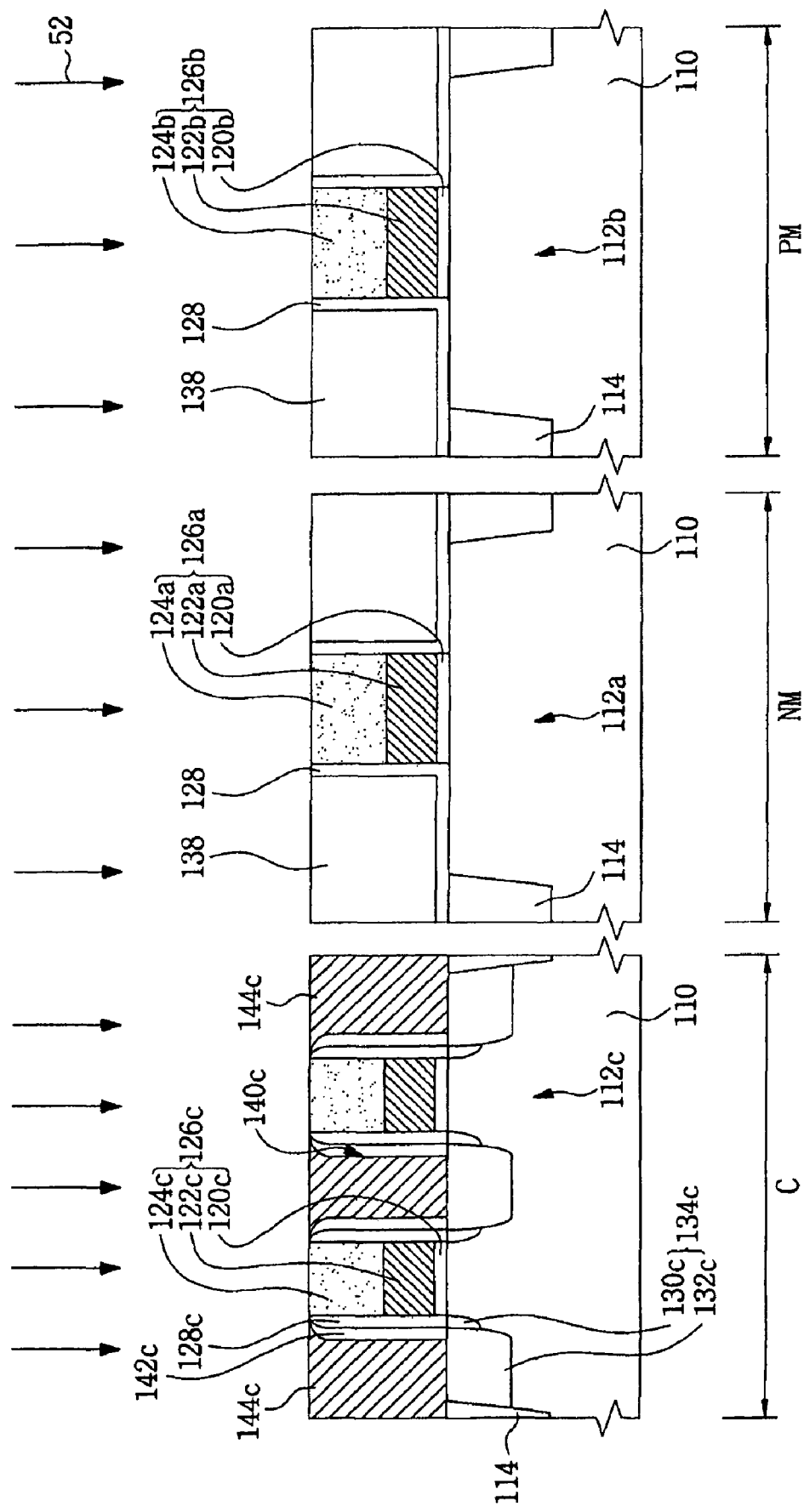

Referring to FIGS. 1 and 5, a conductive layer may be formed on the cell gate patterns 126c, the NMOS gate pattern 126a, the PMOS gate pattern 126b, the cell lower interlayer insulating layer 136 and the peripheral interlayer insulating layer 138 to fill the cell contact holes 140c, according to exemplary embodiments. The conductive layer may comprise a poly-Si layer or a metal layer. When the conductive layer is the poly-Si layer, the conductive layer may be doped in-situ with n-type impurity ions. The conductive layer may be planarized to cause node separation, thereby forming cell conductive pads 144c to electrically connect the cell source and drain regions 134c as illustrated in FIG. 5. The planarization of the conductive layer may be performed using a chemical mechanical polishing (CMP) technique. In this case, upper portions of the cell lower interlayer insulating layer 136, the peripheral interlayer insulating layer 138 and the spacer layer 128 may be partially removed.

When the cell conductive pads 144c are formed of the poly-Si layer, an annealing process 52 may be performed on the cell conductive pads 144c at a temperature of about 800 to 900° C. in order to elevate conductivity of the cell conductive pads 144c, as illustrated in FIG. 5. Also, in this case, the first and second cell impurity regions 130c and 132c may be formed to subsequently overlap the first and second cell spacers as illustrated in FIG. 4.

Figure 6:
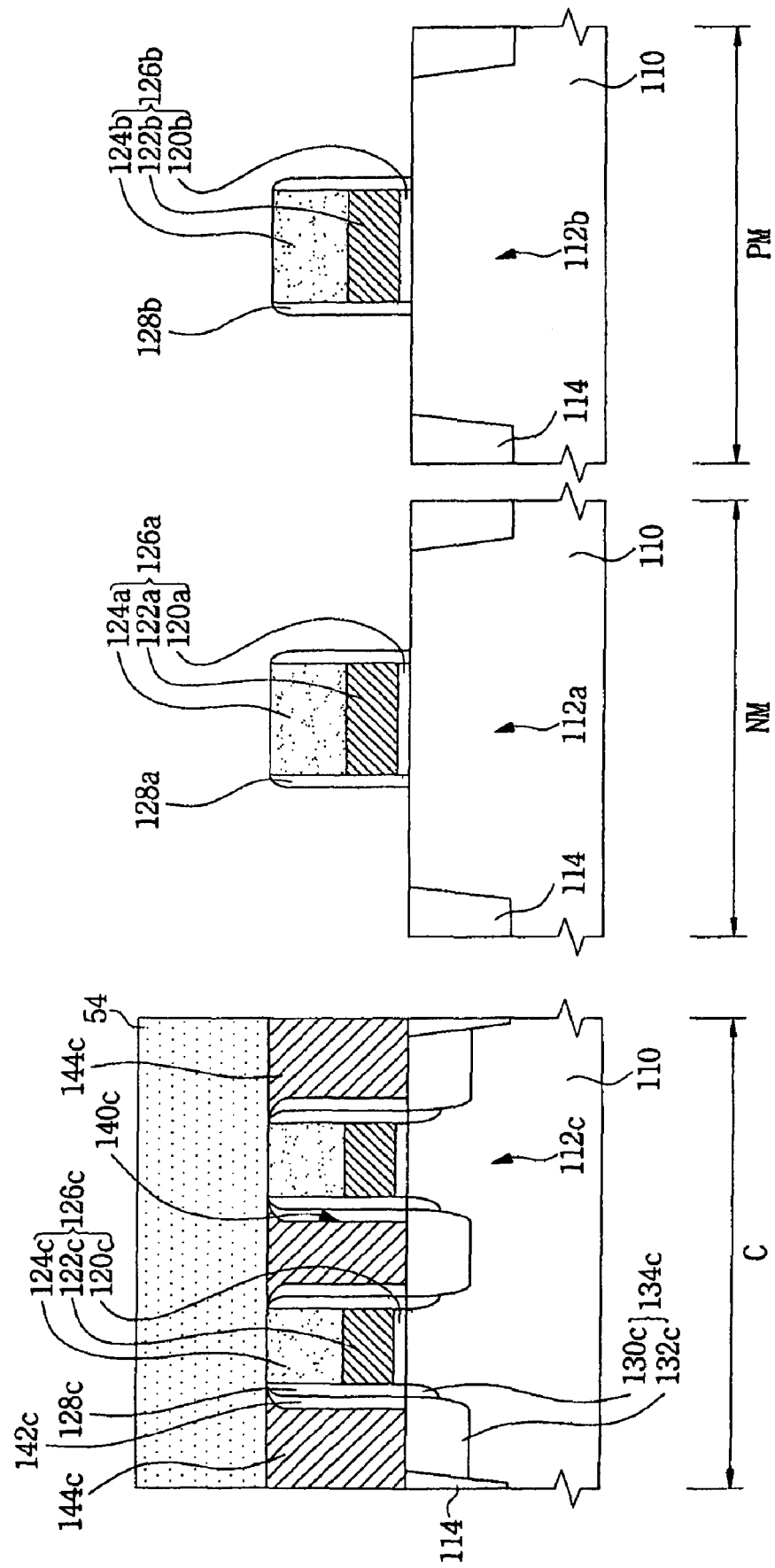

Referring to FIGS. 1 and 6, a first photoresist pattern 54 may be formed to cover the cell array region C and expose the peripheral circuit region P according to exemplary embodiments. The peripheral interlayer insulating layer 138 may be etched using the first photoresist pattern 54 as a mask, thereby exposing the NMOS active region 112a and the PMOS active region 112b of the peripheral circuit region P. In this case, the peripheral interlayer insulating layer 138 may be wholly removed from the NMOS gate pattern 126a and the PMOS gate pattern 126b as illustrated in FIG. 6. Thus, the peripheral interlayer insulating layer 138 is a sacrificial layer formed over the peripheral circuit region while the cell transistors including the cell gate patterns 126c and the cell source and drain regions 134c are formed. Subsequently, the spacer layer 128 in the peripheral circuit region P may be anisotropically etched using the first photoresist pattern 54 as a mask until the NMOS gate pattern 126a and the PMOS gate pattern 126b are exposed, thereby forming first NMOS spacers 128a on sidewalls of the NMOS gate pattern 126a and first PMOS spacers 128b on sidewalls of the PMOS gate pattern 126b as illustrated in FIG. 6.

Figure 7:
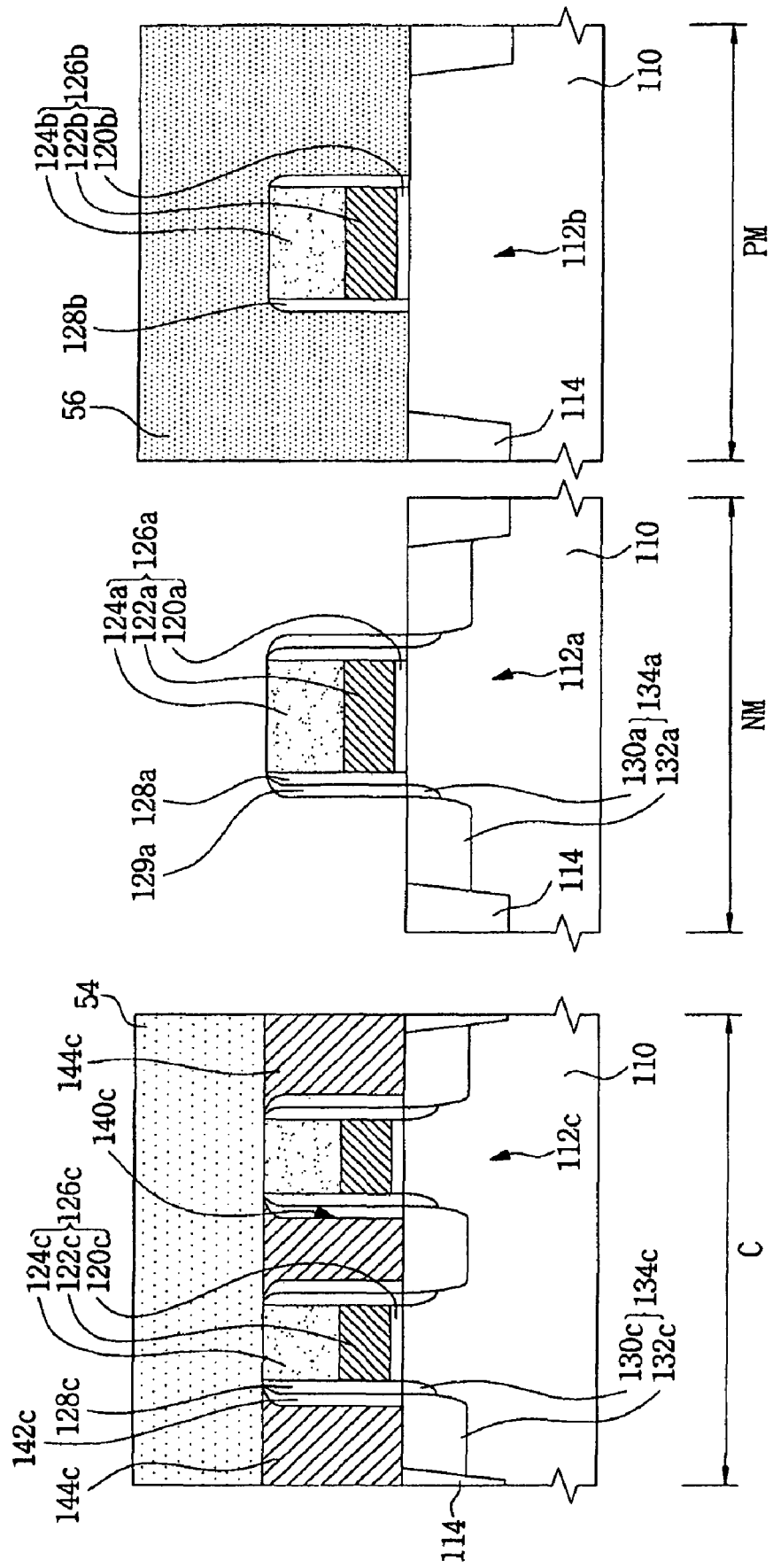

Referring to FIGS. 1 and 7, after the formation of the first NMOS spacers 128a and the first PMOS spacers 128b, the first photoresist pattern 54 is removed from the cell array region C according to exemplary embodiments. A first mask pattern 56 may then be formed to cover the cell array region C and the peripheral PMOS region PM and expose the peripheral NMOS region NM as illustrated in FIG. 7. The first mask pattern 56 may comprise a material having different etch selectivity from the semiconductor substrate 10, the first NMOS spacers 128a and the first PMOS spacers 128b. The first mask pattern 56 may be formed to expose the NMOS active region 112a.

The NMOS active region 112a may be doped with n-type impurity ions using the first mask pattern 56, the NMOS gate pattern 126a and the first NMOS spacers 128a as a mask. As such, first NMOS impurity regions 130a may be formed in the NMOS active region 112a. The first NMOS impurity regions 130a may be formed apart from the NMOS gate pattern 126a by a thickness of the first NMOS spacer 128a on each of sidewalls of the NMOS gate pattern 126a. Then second NMOS spacers 129a may be formed on sidewalls of the first NMOS spacers 128a. The NMOS active region 112a may be doped with n-type impurity ions using the NMOS gate pattern 126a and the first and second NMOS spacers 128a and 129a as a mask. As such, second NMOS impurity regions 132a may be formed in the NMOS active region 112a as illustrated in FIG. 7. The second NMOS impurity regions 132a may be formed apart from the NMOS gate pattern 126a by a thickness of the first and second NMOS spacers 128a and 129a on each of the sidewalls of the NMOS gate pattern 126a.

According to exemplary embodiments, the first NMOS impurity regions 130a may be protruded from the second NMOS impurity region 132a to overlap the second NMOS spacers 129a. The second NMOS impurity regions 132a may have a higher concentration than the first NMOS impurity regions 130a. As such, the first and second NMOS impurity regions 130a and 132a may constitute peripheral NMOS source and drain regions 134a, and a peripheral NMOS transistor comprising the NMOS gate pattern 126a and the peripheral NMOS source and drain regions 134a may be completed. According to the exemplary embodiments, the thickness of the second NMOS spacers 129a may be controlled apart from the thickness of the first cell spacers 128c of the cell array region C, thereby improving a process margin of the peripheral NMOS transistor.

The second NMOS spacers 129a may comprise a material having a lower dielectric constant than the first NMOS spacers 128a, for example, a silicon oxide layer. The second NMOS spacers 129a may function to reduce a parasitic capacitance between the NMOS gate pattern 126a and subsequent plugs to be electrically connected to the first NMOS impurity regions 130a.

Figure 8:
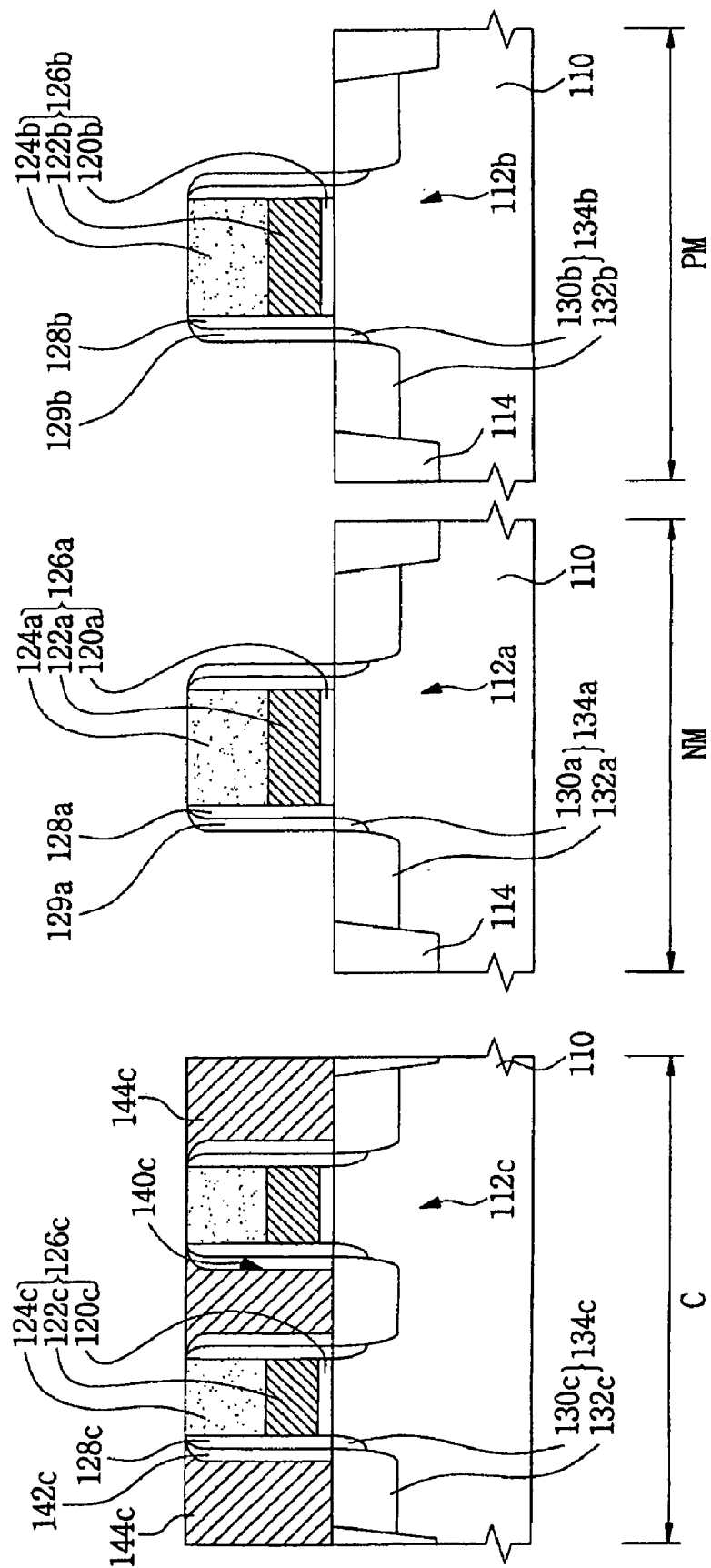

Referring to FIGS. 1 and 8, after the formation of the second NMOS spacers 129a, the first mask pattern 56 is removed from the cell array region C and the peripheral circuit region P. First PMOS impurity regions 130b, second PMOS spacers 129b, and second PMOS impurity regions 132b may be formed sequentially in the PMOS active region 112b as illustrated in FIG. 8, according to exemplary embodiments. The first PMOS impurity regions 130b, the second PMOS spacers 129b, and the second PMOS impurity regions 132b may be formed using the same process as described with reference to FIG. 7. In this case, a second mask pattern may be formed to cover the cell array region C and the peripheral NMOS region NM and expose the peripheral PMOS region PM. The second mask pattern may comprise the same material as the first mask pattern 56. The first and second PMOS impurity regions 130b and 132b may be aligned with respect to the first and second PMOS spacers 128b and 129b.

Thus, the first PMOS impurity regions 130b may be protruded from the second PMOS impurity regions 132b to overlap the second PMOS spacers 129b. Also, the first and second PMOS impurity regions 130b and 132b may have p-type impurity ions, and the second PMOS impurity regions 132b may have a higher concentration than the first PMOS impurity regions 130b. As such, the first and second PMOS impurity regions 130b and 132b may constitute peripheral PMOS source and drain regions 134b, and a peripheral PMOS transistor including the PMOS gate pattern 126b and the peripheral PMOS source and drain regions 134b may be completed. The second PMOS spacers 129b may be formed of a material having a lower dielectric constant than the first PMOS spacers 128b, for example, a silicon oxide layer. The second PMOS spacers 129b may function to reduce a parasitic capacitance between the PMOS gate pattern 126b and subsequent plugs to be electrically connected to the first PMOS impurity regions 130b.

Figure 9:
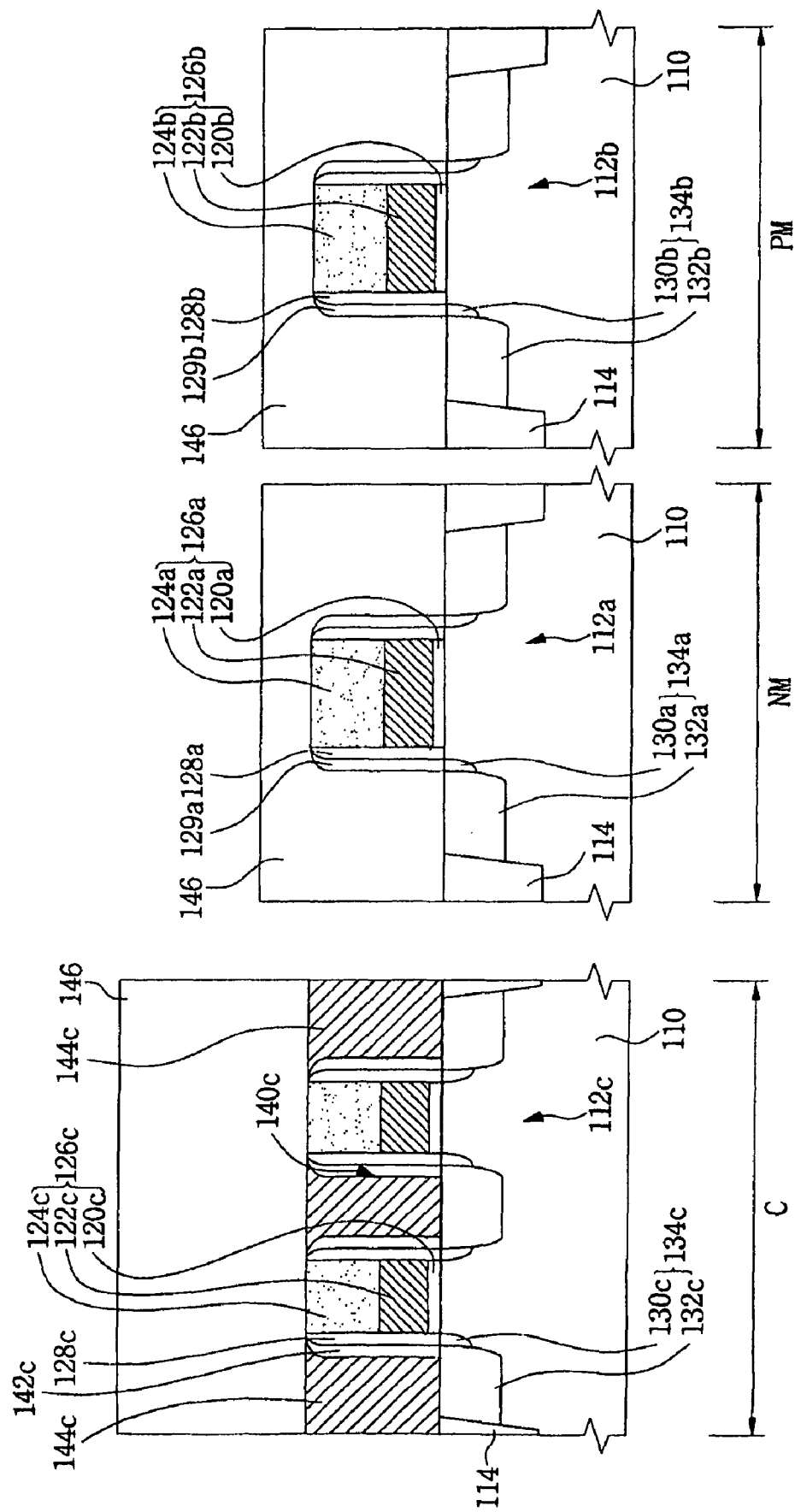

Referring to FIGS. 1 and 9, a preliminary interlayer insulating layer 146 may be formed in the cell array region C and the peripheral circuit region P to cover the cell transistors, the peripheral NMOS transistor, and the peripheral PMOS transistor as illustrated in FIG. 9, according to exemplary embodiments. The preliminary interlayer insulating layer 146 may be formed at a second temperature lower than the first temperature at which the reflow process 50 of FIG. 3 is performed, in order to reduce a thermal burden on the peripheral source and drain regions 134a and 134b. For example, the preliminary interlayer insulating layer 146 may be a high-density plasma (HDP) oxide layer. The HDP oxide layer may be obtained using a high-density plasma CVD (HDP-CVD) technique at a temperature of about 300 to 450° C. lower than the first temperature. The preliminary interlayer insulating layer 146 may also be a silicon oxide layer obtained using a plasma-enhanced CVD (PECVD) process. In this case, the PECVD process may be performed at a temperature of about 300 to 400° C. lower than the first temperature.

Referring to FIGS. 1 and 10, the preliminary interlayer insulating layer 146 may be planarized until the cell gate patterns 126c, the NMOS gate pattern 126a and the PMOS gate pattern 126b are exposed, thereby forming a peripheral lower interlayer insulating layer 147 in the peripheral circuit region P as illustrated in FIG. 10. In this case, the planarization of the preliminary interlayer insulating layer 146 may be performed using an etch-back or a CMP technique. After the formation of the peripheral lower interlayer insulating layer 147, an upper interlayer insulating layer 148 may be formed subsequently on the cell lower interlayer insulating layer 136 and the peripheral lower interlayer insulating layer 147 as illustrated in FIG. 10. The upper interlayer insulating layer 148 may comprise the same material as the cell and peripheral lower interlayer insulating layers 132 and 147.

A cell interconnection 154c may be formed in the upper interlayer insulating layer 148 of the cell array region C to electrically connect the cell conductive pads 144c as illustrated in FIG. 10. The cell interconnection 154c may comprise a doped poly-Si layer or a metal layer. The cell interconnection 154c may be formed to have a cell contact plug 150c and a bit line 152c. Peripheral interconnections may be formed in the upper interlayer insulating layer 148 and the peripheral lower interlayer insulating layer 147 of the peripheral circuit region P. The peripheral interconnections may comprise NMOS interconnections 154a and PMOS interconnections 154b. The NMOS interconnections 154a and the PMOS interconnections 154b may electrically connect the NMOS source and drain regions 134a and the PMOS source and drain regions 134b, respectively. Each of the NMOS interconnections 154a and the PMOS interconnections 154b may be formed of the same material layer as the cell interconnection 154c. In addition, each of the NMOS interconnections 154a may be formed to have a peripheral NMOS contact plug 150a and an NMOS conductive line 152a, and each of the PMOS interconnections 154b may be formed to have a peripheral PMOS contact plug 150b and a PMOS conductive line 152b.

After the formation of the cell and peripheral interconnection 154c, 154a and 154b, the first and second NMOS impurity regions 130a and 132a may be formed to overlap the first and second NMOS spacers 128a and 129a, respectively. And the first and second PMOS impurity regions 130b and 132b may be formed to overlap the first and second PMOS spacers 128a and 129b, respectively. Thus, each of the peripheral transistors may have an effective channel length W as illustrated in FIG. 10. The effective channel length W may be generated under each of the peripheral transistors by heat of the preliminary interlayer insulating layer 146, the upper interlayer insulating layer 148, and the cell and peripheral interconnections 154c, 154a and 154b. The effective channel length W of the peripheral transistors of FIG. 10 is lower in size than the effective channel length of the peripheral transistor formed through the prior art. As such, the cell and peripheral interconnections 154c, 154a and 154b may constitute a semiconductor device 160 together with the cell transistors and the peripheral transistors as illustrated in FIGS. 1 and 10.

A semiconductor device according to exemplary embodiments may comprise cell transistors and peripheral transistors subjected to different temperatures during performance of a semiconductor fabrication. The cell transistors may be subjected to a high temperature used for performing a reflow process and an annealing process. The peripheral transistors may be subjected to a low temperature compared with the cell transistors because of being fabricated after completing the cell transistors. Thus, the peripheral transistors may be controlled apart from the cell transistors. In addition, impurity ions of a source or drain region in the peripheral transistors are less subject to diffusing toward the drain or source region compared with the conventional art. As such, occurrence of a short channel effect and increase in sheet resistance of the drain and source regions is prevented in the peripheral transistors. A method of fabricating a semiconductor device according to the exemplary embodiments may be applied to various memory devices, for example, a dynamic random access memory (DRAM) device, a flash memory device, a phase-change random access memory (PRAM) device, a ferroelectric random access memory (FRAM) device, and a magnetic random access memory (MRAM) device.

While exemplary embodiments have been disclosed herein, it should be understood that other variations may be possible. Such variations are not to be regarded as a departure from the spirit and scope of exemplary embodiments of the present application, and all such modifications as would be obvious to one skilled in the art are intended to be included within the scope of the following claims.

What is claimed is:

1. A method of fabricating a semiconductor device, comprising:
   preparing a substrate including a cell array region and a peripheral circuit region, the cell array region and the peripheral circuit region having a cell active region and peripheral active regions;
   forming a cell gate pattern on the cell active region and peripheral gate patterns on the peripheral active regions;
   forming first cell impurity regions in the cell active region, the first cell impurity regions being formed adjacent to the cell gate pattern;
   forming a first insulating layer on the cell array region and a sacrificial insulating layer on the peripheral circuit region to surround the cell gate pattern and the peripheral gate patterns respectively;
   forming cell conductive pads in the first insulating layer of the cell array region to electrically connect the first cell impurity regions;
   wholly removing the sacrificial insulating layer adjacent to the peripheral gate patterns from the substrate;
   sequentially forming first and second peripheral impurity regions in the peripheral active regions to be apart from the peripheral gate patterns; and forming a second insulating layer in the peripheral circuit region to surround the peripheral gate patterns, wherein the method comprises performing a first temperature process step at a first temperature more than about 700° C. on the first insulating layer and the sacrificial insulating layer before the removing of the sacrificial insulating layer, and performing a second temperature process step at a second temperature less than the first temperature on the second insulating layer after the wholly removing of the sacrificial insulating layer; and wherein the first and second peripheral impurity regions are diffused toward the peripheral gate patterns through the second temperature process to align with the peripheral gate patterns.

2. The method according to claim 1, further comprising:

before forming the first insulating layer and the sacrificial insulating layer, conformally forming a spacer layer on the cell active region and the peripheral active regions to cover the cell gate pattern and the peripheral gate patterns, wherein the wholly removing of the sacrificial insulating layer is performed until the spacer layer adjacent to a lower portion of the peripheral gate patterns is exposed.

3. The method according to claim 2, wherein the forming of the first peripheral impurity regions comprises, forming a photoresist pattern in the cell array region to expose the peripheral active regions of the peripheral circuit region;

etching the spacer layer on the peripheral active regions using the photoresist pattern as a mask to form first peripheral spacers on sidewalls of the peripheral gate patterns;

removing the photoresist pattern from the cell array region;

forming a first mask pattern in the cell array region and the peripheral circuit region to expose a selective peripheral active region and cover the cell active region and the remaining peripheral active region; and implanting first impurity ions in the selective peripheral active region using the first mask pattern, the first peripheral spacers, and a selective peripheral gate pattern on the selective peripheral active region as a mask, wherein the first peripheral impurity regions are aligned with the first peripheral spacers to be apart from the selective peripheral gate pattern.

4. The method according to claim 3, further comprising:

forming second peripheral spacers on the first peripheral spacers of the selective peripheral gate pattern; and implanting third impurity ions in the selective peripheral active region using the first mask pattern, the first and second peripheral spacers, and the selective peripheral gate pattern as a mask to form third peripheral impurity regions, the third peripheral impurity regions are aligned with the second peripheral spacers to be more apart from the selective peripheral gate pattern than the first peripheral impurity regions; and removing the first mask pattern from the cell array region and the peripheral circuit region, wherein the third peripheral impurity regions have a higher concentration than the first peripheral impurity regions, the first and third impurity ions have the same conductivity, and the second peripheral spacers comprise a material layer having a lower dielectric constant than the first peripheral spacers.

5. The method according to claim 4, wherein the forming of the second peripheral impurity regions comprises, forming a second mask pattern in the cell array region and the peripheral circuit region to expose the remaining peripheral active region and cover the cell active region and the selective peripheral active region; and implanting second impurity ions in the remaining peripheral active region using the second mask pattern, the first peripheral spacers, and the remaining peripheral gate pattern on the remaining peripheral active region, wherein the second peripheral impurity regions have different conductivity from the first peripheral impurity regions, and the second peripheral impurity regions are aligned with the first peripheral spacers of the remaining peripheral active region to be apart from the remaining peripheral gate pattern.

6. The method according to claim 5, further comprising:

forming third peripheral spacers on the first peripheral spacers of the remaining peripheral gate pattern;

implanting fourth impurity ions in the remaining peripheral active region using the second mask pattern, the first and third peripheral spacers, and the remaining peripheral gate pattern as a mask to form fourth peripheral impurity regions, the fourth peripheral impurity regions are aligned with the third peripheral spacers to be more apart from the remaining peripheral gate pattern than the second peripheral impurity regions; and removing the second mask pattern from the cell array region and the peripheral circuit region, wherein the fourth peripheral impurity regions have a higher concentration than the second peripheral impurity regions, the second and fourth impurity ions have the same conductivity, and the third peripheral spacers comprise a material layer having a lower dielectric constant than the first peripheral spacers.

7. The method according to claim 2, further comprising, before forming the first insulating layer and the sacrificial insulating layer, forming second cell impurity regions in the cell active region to be apart from the cell gate pattern by a thickness of the spacer layer on each of sidewalls of the cell gate pattern, wherein the second cell impurity regions have a higher concentration than the first cell impurity regions.

8. The method according to claim 7, wherein the forming of the cell conductive pads comprises:

forming preliminary cell contact holes in the first insulating layer of the cell array region using the cell gate pattern and the spacer layer as a mask to expose the spacer layer;

etching the spacer layer through the preliminary cell contact holes to form first cell spacers and to form cell contact holes exposing the cell active region adjacent to the cell gate pattern;

forming a conductive layer on the first insulating layer and the sacrificial insulating layer to fill the cell contact holes; and etching the conductive layer until the first insulating layer and the sacrificial insulating layer are exposed.

9. The method according to claim 8, further comprising, before forming the cell conductive pads, forming second cell spacers on sidewalls of the first cell spacers, wherein the second cell spacers comprise a material having a lower dielectric constant than the first cell spacers.

10. The method according to claim 1, wherein the first temperature process step comprises, reflowing the first insulating layer and the sacrificial insulating layer at a temperature in the range of about 700 to 850° C. after the forming of the first insulating layer and the sacrificial insulating layer; and annealing the cell conductive pads at a temperature in the range of about 800 to 900° C. after the forming of the cell conductive pads, in a case in which the cell conductive pads are formed of a poly-Si layer.

11. The method according to claim 7, wherein the first insulating layer and the sacrificial insulating layer are formed of the same material using a one-time deposition process, wherein the one-time deposition process comprises:
forming an insulating layer on the spacer layer; and
reflowing the insulating layer to surround the cell gate pattern and the peripheral gate patterns.

12. The method according to claim 6, wherein a temperature during forming the first insulating layer is higher than that during forming the second insulating layer.

13. The method according to claim 12, wherein the first insulating layer is a boron phosphorus silicate glass (BPSG) layer, and the second insulating layer is a high-density plasma (HDP) oxide layer.

14. The method according to claim 13, further comprising planarizing the second insulating layer until the cell gate pattern and the peripheral gate patterns are exposed.

15. The method according to claim 14, further comprising:
forming a third insulating layer on the first insulating layer and the second insulating layer to cover the cell gate pattern and the peripheral gate patterns; and
forming cell interconnections in the first insulating layer and the third insulating layer to electrically connect the cell conductive pads; and
forming peripheral interconnections in the second insulating layer and the third insulating layer to electrically connect the first to fourth peripheral impurity regions,
wherein the first and third peripheral impurity regions are diffused toward sidewalls of the peripheral gate patterns to respectively overlap with the first and second peripheral spacers after the forming of the second and third insulating layers, and the cell and peripheral interconnections, and
wherein the second and fourth peripheral impurity regions are diffused toward the sidewalls of the peripheral gate patterns to respectively overlap with the first and third peripheral spacers after the forming of the second and third insulating layers and the cell and peripheral interconnections.

16. The method according to claim 6, wherein the peripheral active regions comprise an NMOS active region and a PMOS active region,
wherein the peripheral gate patterns are formed to have an NMOS gate pattern and a PMOS gate pattern respectively on the NMOS active region and the PMOS active region, and the first and third peripheral impurity regions are formed to have n-type conductivity adjacent to the NMOS gate pattern, the second and fourth peripheral impurity regions are formed of p-type conductivity adjacent to the PMOS gate pattern.

* * * * *